(12) United States Patent
Hall et al.

(10) Patent No.: US 8,975,722 B2
(45) Date of Patent: Mar. 10, 2015

(54) MEMS DEVICE AND METHOD OF MANUFACTURE

(71) Applicant: Texas Instruments Incorporated, Dallas, TX (US)

(72) Inventors: James N. Hall, Parker, TX (US); Lance W. Barron, Plano, TX (US); Cuiling Gong, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/282,892

(22) Filed: May 20, 2014

(65) Prior Publication Data

US 2014/0252419 A1  Sep. 11, 2014

Related U.S. Application Data

(63) Continuation of application No. 13/646,864, filed on Oct. 8, 2012, now Pat. No. 8,729,657.

(60) Provisional application No. 61/544,130, filed on Oct. 6, 2011.

(51) Int. Cl.
| | | |
|---|---|---|
| *H01L 21/70* | (2006.01) | |
| *H01L 27/118* | (2006.01) | |
| *G11C 23/00* | (2006.01) | |
| *H01L 21/77* | (2006.01) | |

(52) U.S. Cl.
CPC ............... *H01L 27/118* (2013.01); *G11C 23/00* (2013.01); *H01L 21/77* (2013.01); *H01L 27/11803* (2013.01)

USPC .......................................................... 257/499

(58) Field of Classification Search
CPC .............. B81B 2201/02; B81B 3/0062; B81B 2203/01; B81B 2203/0154; B81B 2203/0181; B81B 7/0003; H01L 27/118
USPC ........................... 257/499, 209; 395/295, 238
See application file for complete search history.

(56) References Cited

U.S. PATENT DOCUMENTS

| | | | |
|---|---|---|---|
| 2009/0146226 A1* | 6/2009 | Bozler | 257/415 |
| 2009/0159409 A1* | 6/2009 | Keimel et al. | 200/181 |

* cited by examiner

*Primary Examiner* — Yu-Hsi D Sun
*Assistant Examiner* — Christina Sylvia
(74) *Attorney, Agent, or Firm* — Jacqueline J. Garner; Frederick J. Telecky, Jr.

(57) ABSTRACT

A MEMS logic device comprising a gate which pivots on a torsion hinge, two conductive channels on the gate, one on each side of the torsion hinge, source and drain landing pads under the channels, and two body bias elements under the gate, one on each side of the torsion hinge, so that applying a threshold bias between one body bias element and the gate will pivot the gate so that one channel connects the respective source and drain landing pad, and vice versa. An integrated circuit with MEMS logic devices on the dielectric layer, with the source and drain landing pads connected to metal interconnects of the integrated circuit. A process of forming the MEM switch.

12 Claims, 15 Drawing Sheets

MEMS DEVICE AND METHOD OF MANUFACTURE

This application is a continuation of U.S. application Ser. No. 13/646,864, filed Oct. 8, 2012 which claims the benefit of Provisional Application No. 61/544,130, filed Oct. 6, 2011, the entireties of both of which are hereby incorporated by reference.

BACKGROUND

This relates to microelectromechanical system (MEMS) devices.

MEMS logic devices may be configured as digital logic elements to provide, for example, higher temperature operation, more radiation hardness, and/or higher voltage operation compared to logic elements formed in conventional semiconductor integrated circuits.

SUMMARY

A configurable multi-function MEMS logic device and its method of manufacture are disclosed.

An example embodiment may be formed by a torsion hinge supporting a pivoting gate above a substrate, so that the gate can pivot down toward the substrate on either side of the torsion hinge. The torsion hinge may be similar to that used in a digital micromirror device (DMD), such as a DLP™ micromirror device available from Texas Instruments. Two electrically conductive channels are attached to the gate, one on each side of the gate pivot axis. The channels are electrically isolated from the gate. Each channel has a source contact on one end of the channel and a drain contact on an opposite end of the channel. A first source landing pad and a first drain landing pad are disposed on the substrate under the source contact and drain contact, respectively, of the first channel. A second source landing pad and a second drain landing pad are disposed under the source contact and drain contact, respectively, of the second channel. A first body bias element is disposed on the substrate adjacent to the first channel, and a second body bias element is disposed on the substrate adjacent to the second channel. When a sufficient bias difference is applied between the gate and the first body bias element, the gate pivots on the torsion hinge so that the source contact of the first channel makes electrical contact to the first source landing pad and the drain contact of the first channel makes electrical contact to the first drain landing pad, while the source contact of the second channel is held above the second source landing pad so as to not make electrical contact and the drain contact of the second channel is held above the second drain landing pad so as to not make electrical contact. Similarly, when a sufficient bias difference is applied between the gate and the second body bias element, the gate pivots on the torsion hinge so that the source contact of the second channel makes electrical contact to the second source landing pad and the drain contact of the second channel makes electrical contact to the second drain landing pad, while the source contact of the first channel is held above the first source landing pad so as to not make electrical contact and the drain contact of the first channel is held above the first drain landing pad so as to not make electrical contact.

Bias potentials and signals may be applied to the gate, body bias elements and source and drain landing pads so that the MEMS logic device may function as various digital elements, such as, for example, a digital multiplexer, an inverse multiplexer, an inverter, a non-inverting buffer, referred to simply as a buffer, a two-input AND-gate, a two-input OR-gate, a memory element, a stage of a charge pump, and a stage of an oscillator.

In one embodiment, a plurality of MEMS logic devices configured as digital elements may be combined in an integrated circuit to form digital circuits. Connections to the gate, body bias elements and source and drain landing pads of the MEMS logic devices may be hardwired in metal interconnect elements of the integrated circuit. In another embodiment, connections to the gate, body bias elements and source and drain landing pads of the MEMS logic devices may be made using programmable semiconductor circuits such as field programmable gate arrays.

A described embodiment of a microelectromechanical system (MEMS) switch includes a substrate; an electrically conductive gate terminal on the substrate; an electrically conductive first source landing pad on the substrate proximate to the gate terminal; an electrically conductive first drain landing pad on the substrate proximate to the gate terminal, on a same side of the gate terminal as the first source landing pad; an electrically conductive second source landing pad on the substrate proximate to the gate terminal, on an opposite side of the gate terminal from the first source landing pad; an electrically conductive second drain landing pad on the substrate proximate to the gate terminal, on a same side of the gate terminal as the second source landing pad; an electrically conductive first body bias element on the substrate adjacent to the gate terminal, on the same side of the gate terminal as the first source landing pad; an electrically conductive second body bias element on the substrate adjacent to the gate terminal, on the same side of the gate terminal as the second source landing pad; electrically conductive hinge posts connected to the gate terminal; a torsion hinge connected to the hinge posts; an electrically conductive gate attached to the torsion hinge; a channel isolation layer on the gate; an electrically conductive first channel on the channel isolation layer, the first channel including a first source contact over the first source landing pad and a first drain contact over the first drain landing pad, the first channel being electrically isolated from the gate; and an electrically conductive second channel on the channel isolation layer, the second channel including a second source contact over the second source landing pad and a second drain contact over the second drain landing pad, the second channel being electrically isolated from the gate. The gate is configured to pivot on the torsion hinge so that the first source contact touches and makes electrical contact with the first source landing pad and the first drain contact touches and makes electrical contact with the first drain landing pad when a threshold bias potential difference is applied between the gate terminal and the first body bias element; and the gate is configured to pivot on the torsion hinge so that the second source contact touches and makes electrical contact with the second source landing pad and the second drain contact touches and makes electrical contact with the second drain landing pad when a threshold bias potential difference is applied between the gate terminal and the second body bias element.

In various implementations, a portion of the hinge posts are formed of a same material as a portion of the torsion hinge. The gate may include a same material layer as the torsion hinge. The MEMS logic device may occupy an area on the substrate less than 200 square microns. Switching time for the MEMS logic device, which is a time for the gate to pivot and lift the first source contact off the first source landing pad and the first drain contact off the first drain landing pad, and subsequently continue pivoting so that the second source contact touches and makes electrical contact with the second source landing pad and the second drain contact touches and makes electrical contact with the second drain landing pad, may be less than 20 microseconds.

An integrated circuit may be formed with a plurality of transistors; an interconnect dielectric layer on the transistors; a plurality of contacts in the interconnect dielectric layer, the contacts making electrical connections to the transistors; a plurality of metal interconnects in the interconnect dielectric layer over the contacts and the transistors, the metal interconnects making electrical connections to the contacts; and a plurality of the described MEMS logic devices on the interconnect dielectric layer and the metal interconnects. At least a portion of the MEMS logic devices may be configured as logic gates, memory cells, multiplexers or charge pumps.

A described process of forming a MEMS logic device includes providing a substrate; forming an electrically conductive gate terminal on the substrate; forming an electrically conductive first source landing pad on the substrate proximate to the gate terminal; forming an electrically conductive first drain landing pad on the substrate proximate to the gate terminal concurrently with the first source landing pad, on a same side of the gate terminal as the first source landing pad; forming an electrically conductive second source landing pad on the substrate proximate to the gate terminal, on an opposite side of the gate terminal from the first source landing pad, concurrently with the first source landing pad; forming an electrically conductive second drain landing pad on the substrate proximate to the gate terminal, on a same side of the gate terminal as the second source landing pad, concurrently with the first source landing pad; forming an electrically conductive first body bias element on the substrate adjacent to the gate terminal, on the same side of the gate terminal as the first source landing pad; forming an electrically conductive second body bias element on the substrate adjacent to the gate terminal, on the same side of the gate terminal as the second source landing pad, concurrently with the first body bias element; subsequently forming electrically conductive hinge posts so that the hinge posts contact, and make electrical connection to, the gate terminal; forming a torsion hinge so that the torsion hinge is connected to the hinge posts; forming an electrically conductive gate so that the gate is connected to the torsion hinge, and the gate is electrically connected to the hinge posts; forming a channel isolation layer on the gate; forming an electrically conductive first channel on the channel isolation layer, so that the first channel includes a first source contact over the first source landing pad and a first drain contact over the first drain landing pad, and so that the first channel is electrically isolated from the gate; and forming an electrically conductive second channel on the channel isolation layer, so that the second channel includes a second source contact over the second source landing pad and a second drain contact over the second drain landing pad, and so that the second channel is electrically isolated from the gate. The gate may be configured to pivot on the torsion hinge so that the first source contact touches and makes electrical contact with the first source landing pad and the first drain contact touches and makes electrical contact with the first drain landing pad when a threshold bias potential difference is applied between the gate terminal and the first body bias element. The gate may be configured to pivot on the torsion hinge so that the second source contact touches and makes electrical contact with the second source landing pad and the second drain contact touches and makes electrical contact with the second drain landing pad when a threshold bias potential difference is applied between the gate terminal and the second body bias element.

In the process, at least portion of the hinge posts may be formed concurrently with a portion of the torsion hinge. The gate may be formed concurrently with the torsion hinge. The gate terminal may be formed concurrently with the first source landing pad. The first body bias element and the second body bias element are formed concurrently with the first source landing pad.

BRIEF DESCRIPTION OF THE DRAWINGS

Example embodiments are described with reference to accompanying drawings, wherein.

DETAILED DESCRIPTION OF EXAMPLE EMBODIMENTS

Figure 1A:
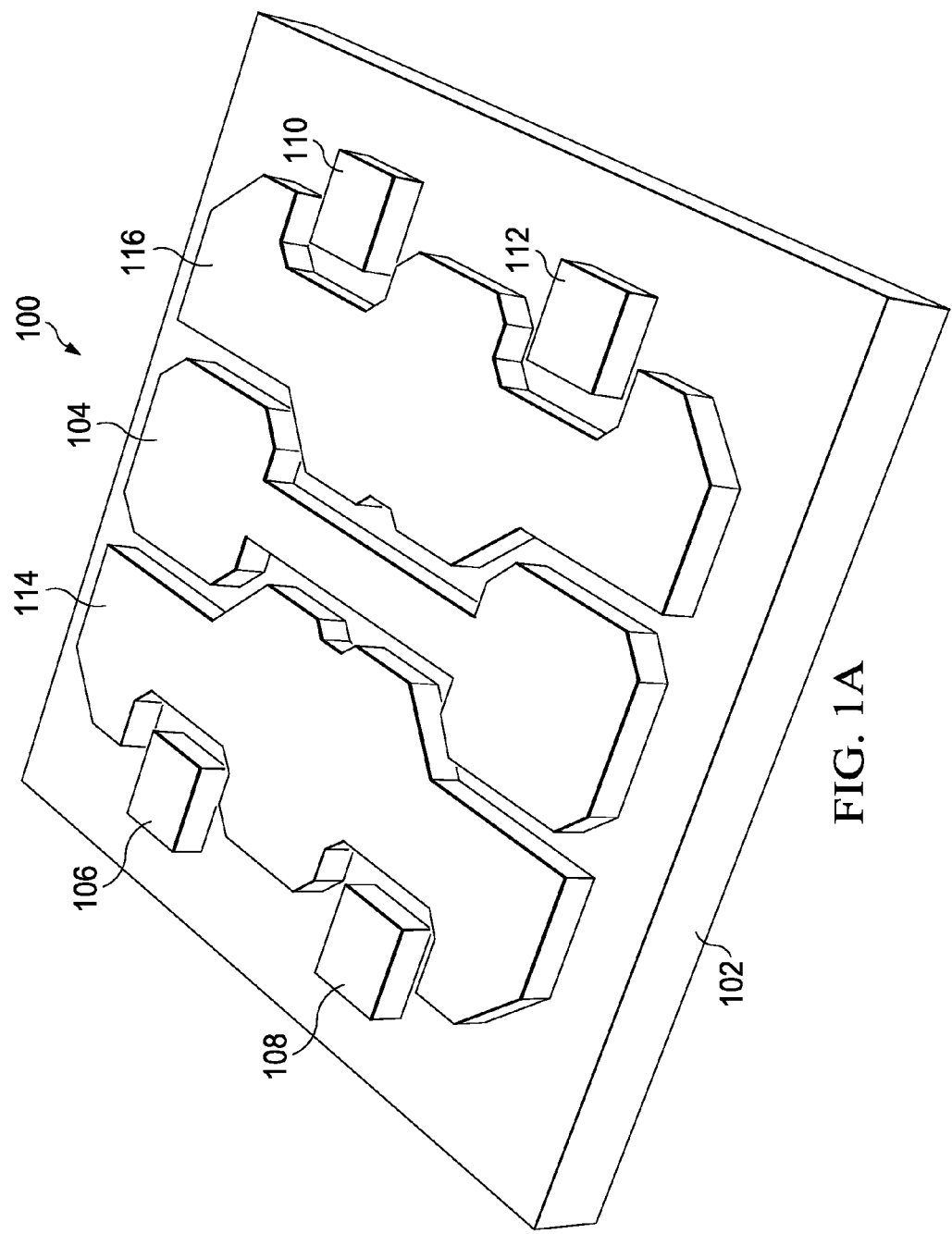
FIGS. 1A through 1E are perspective views of a MEMS logic device formed according to an embodiment, depicted in successive stages of fabrication.

A configurable multi-function MEMS logic device, referred to herein as a MEMS logic device, may be formed by a torsion hinge supporting a pivoting gate above a substrate, so that the gate can pivot down toward the substrate on either side of the torsion hinge. The torsion hinge may be similar to that used in a digital micromirror device (DMD) such as a DLP™ micromirror device available from Texas Instruments, Dallas, Tex. Two electrically conductive channels are attached to the gate, one on each side of the gate pivot axis. The channels are electrically isolated from the gate. Each channel has a source contact on one end of the channel and a drain contact on an opposite end of the channel. A first source landing pad and a first drain landing pad are disposed on the substrate under the source contact and drain contact, respectively, of the first channel. A second source landing pad and a second drain landing pad are disposed under the source contact and drain contact, respectively, of the second channel. A first body bias element is disposed on the substrate adjacent to the first channel, and a second body bias element is disposed on the substrate adjacent to the second channel. When a sufficient bias potential difference is applied between the gate and the first body bias element, the gate pivots on the torsion hinge so that the source contact of the first channel makes electrical contact to the first source landing pad and the drain contact of the first channel makes electrical contact to the first drain landing pad, while the source contact of the second channel is held above the second source landing pad so as to not make electrical contact and the drain contact of the second channel is held above the second drain landing pad so as to not make electrical contact. Similarly, when a sufficient bias potential difference is applied between the gate and the second body bias element, the gate pivots on the torsion hinge so that the source contact of the second channel makes electrical contact to the second source landing pad and the drain contact of the second channel makes electrical contact to the second drain landing pad, while the source contact of the first channel is held above the first source landing pad so as to not make electrical contact and the drain contact of the first channel is held above the first drain landing pad so as to not make electrical contact.

Bias potentials and signals may be applied to the gate, body bias elements and source and drain landing pads so that the MEMS logic device may function as various digital elements, such as a digital multiplexer, an inverse multiplexer an inverter, a non-inverting buffer, a two-input AND-gate, a two-input OR-gate, a memory element, a stage of a charge pump, and a stage of an oscillator.

In one embodiment, MEMS logic devices configured as digital elements may be combined in an integrated circuit to form digital circuits. Connections to the gate, body bias elements and source and drain landing pads of the MEMS logic devices may be hardwired in metal interconnect elements of the integrated circuit. In another embodiment, connections to the gate, body bias elements and source and drain landing pads of the MEMS logic devices may be made using programmable semiconductor circuits such as field programmable gate arrays.

FIGS. 1A through 1E show successive stages in an example method of fabrication of a MEMS logic device according to an embodiment.

As shown in FIG. 1A, the MEMS logic device 100 is formed on a substrate 102 for example an integrated circuit, semiconductor substrate, dielectric substrate such as sapphire or quartz, or other material suitable providing a suitable base for MEMS devices. An electrically conductive gate terminal 104 is formed on the substrate 102, for example by depositing a metal layer containing aluminum on the substrate, forming an etch mask of photoresist on the metal layer, removing unwanted material from the metal layer using a reactive ion etch (RIE) process and subsequently removing the photoresist etch mask. Other methods of forming the gate terminal 104 are within the scope of the instant embodiment.

An electrically conductive first source landing pad 106 and an electrically conductive first drain landing pad 108 are formed on the substrate proximate to, and on one side of, the gate terminal 104. An electrically conductive second source landing pad 110 and an electrically conductive second drain landing pad 112 are formed on the substrate proximate to the gate terminal 104 opposite the first source landing pad 106 and first drain landing pad 108. The first source landing pad 106, first drain landing pad 108, second source landing pad 110 and second drain landing pad 112 may be formed as described above in reference to the gate terminal 104. The first source landing pad 106, first drain landing pad 108, second source landing pad 110 and second drain landing pad 112 may be formed concurrently with the gate terminal 104. Portions of the first source landing pad 106 and first drain landing pad 108 may possibly extend on both sides of the gate terminal 104.

An electrically conductive first body bias element 114 is formed on the substrate 102 adjacent to the gate terminal 104 on the same side as the first source landing pad 106 and first drain landing pad 108. An electrically conductive second body bias element 116 is formed on the substrate 102 adjacent to the gate terminal 104 on the same side as the second source landing pad 110 and second drain landing pad 112. The first body bias element 114 and second body bias element 116 may be formed as described above in reference to the gate terminal 104. The first body bias element 114 and second body bias element 116 may be formed concurrently with the gate terminal 104 or concurrently with the first source landing pad 106, first drain landing pad 108, second source landing pad 110 and second drain landing pad 112. Portions of the first body bias element 114 and second body bias element 116 may possibly extend on both sides of the gate terminal 104.

The gate terminal 104, first source landing pad 106, first drain landing pad 108, second source landing pad 110, second drain landing pad 112, first body bias element 114 and/or second body bias element 116 may make electrical connections to circuits in the substrate 102. The gate terminal 104, first source landing pad 106, first drain landing pad 108, second source landing pad 110, second drain landing pad 112, first body bias element 114 and/or second body bias element 116 may be formed concurrently with metal interconnects in the substrate 102.

Figure 1B:
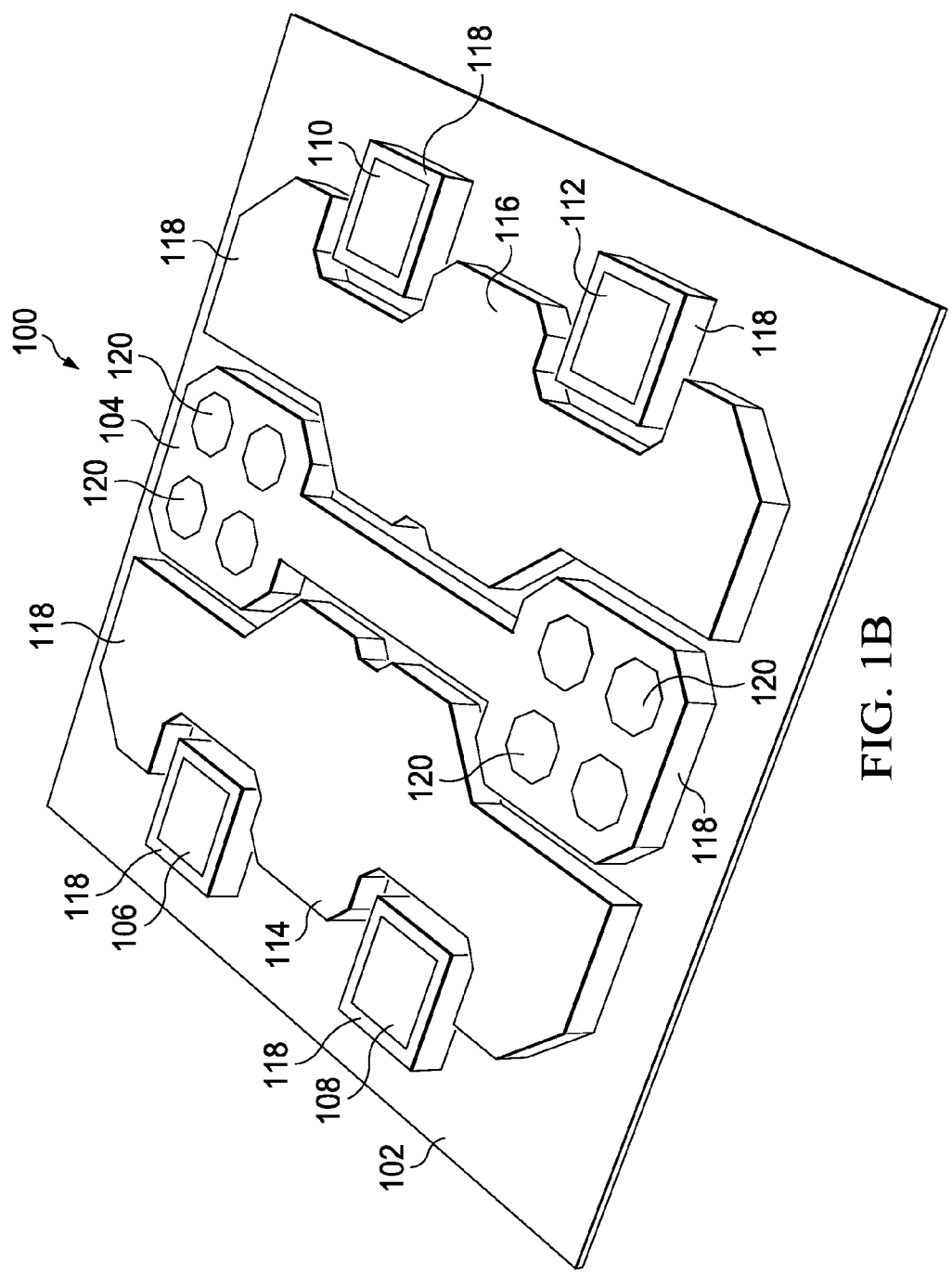

Referring to FIG. 1B, an optional electrode dielectric layer 118 may be formed over the gate terminal 104, first source landing pad 106, first drain landing pad 108, second source landing pad 110, second drain landing pad 112, first body bias element 114 and/or second body bias element 116. The electrode dielectric layer 118, if formed, may be silicon oxide, silicon nitride, silicon oxynitride, aluminum oxide, organic polymer, or other dielectric material. The electrode dielectric layer 118 may be formed using chemical vapor deposition (CVD), plasma enhanced chemical vapor deposition (PECVD), low pressure chemical vapor deposition (LPCVD), atmospheric pressure chemical vapor deposition (APCVD), high density plasma (HDP), an ozone based thermal chemical vapor deposition (CVD) process, also known as the high aspect ratio process (HARP), or other suitable dielectric layer formation process. At least a portion of the first source landing pad 106, first drain landing pad 108, second source landing pad 110 and second drain landing pad 112 are exposed through the electrode dielectric layer 118 to provide electrical contact areas for subsequently formed channels. Post areas 120 on the gate terminal 104 are exposed through the electrode dielectric layer 118 to provide electrical connections for subsequently formed hinge posts.

Figure 1C:
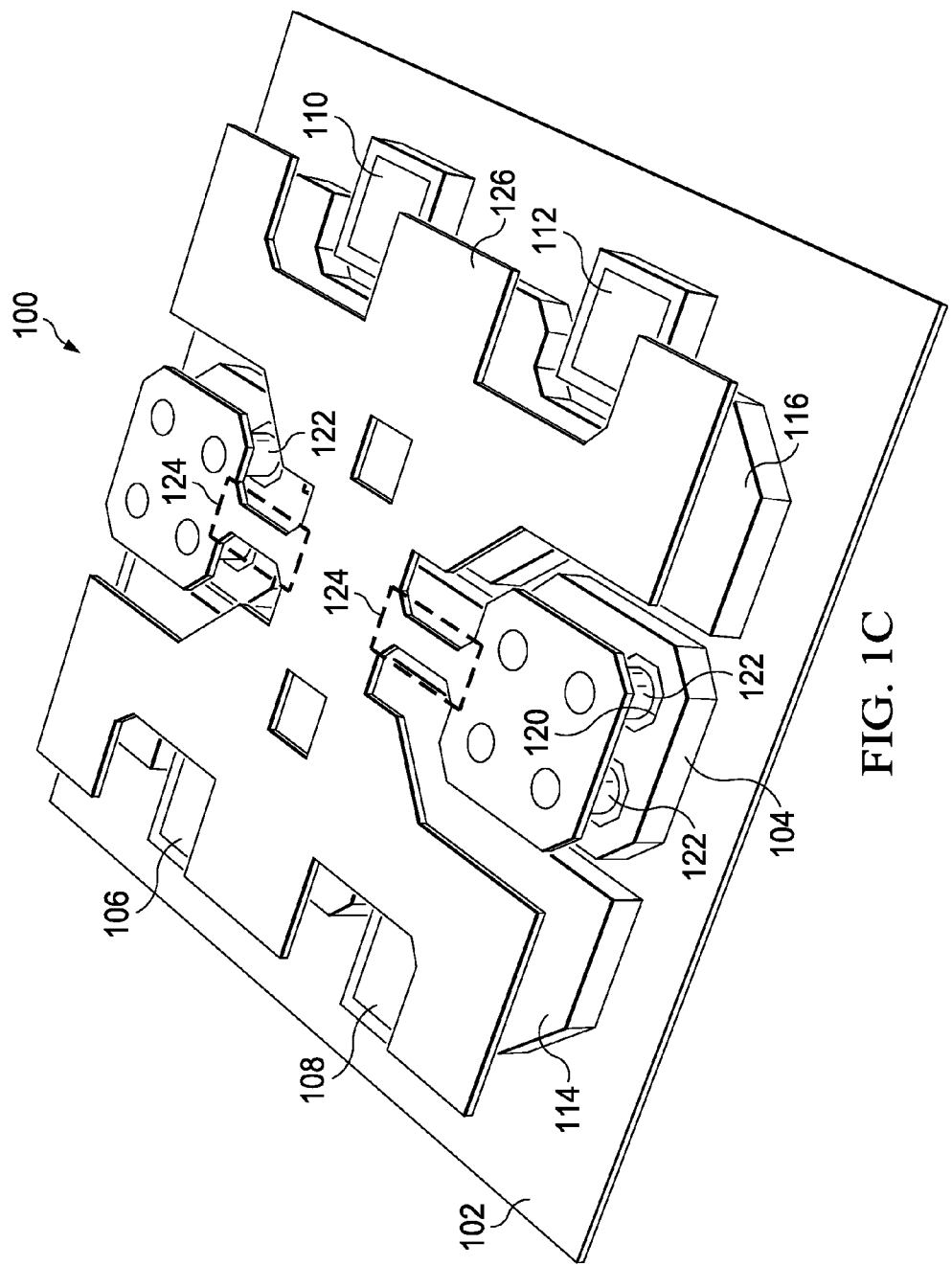

Referring to FIG. 1C, hinge posts 122, a torsion hinge 124 and gate 126 are formed over the substrate 102. The hinge posts 122 make electrical connection to the post areas 120 on the gate terminal 104. The gate 126 is disposed above, and not in contact with, the first body bias element 114 and second body bias element 116. The hinge posts 122 are electrically connected to the gate 126, possibly through the torsion hinge 124 as depicted in FIG. 1C. In the version of the instant embodiment depicted in FIG. 1C, the hinge posts 122, gate 126 and torsion hinge 124 are formed concurrently of a layer of metal hinge material, possibly including titanium and aluminum. Portions of the hinge posts 122, gate 126 and torsion hinge 124 may be formed concurrently, for example, by forming a patterned sacrificial layer of organic polymer such as photoresist or polyimide over the substrate with holes over the post areas 120, depositing the layer of metal hinge material on the sacrificial layer and in the holes, forming an etch mask of photoresist on the layer of metal hinge material, removing unwanted metal hinge material using an RIE process, removing the etch mask, and subsequently removing the sacrificial layer using an isotropic gas phase etch process, for example a downstream ash process. In other versions of the instant embodiment, hinge posts 122 may be formed separately from the gate 126, and/or the gate 126 may be formed separately from the torsion hinge 124.

Figure 1D:
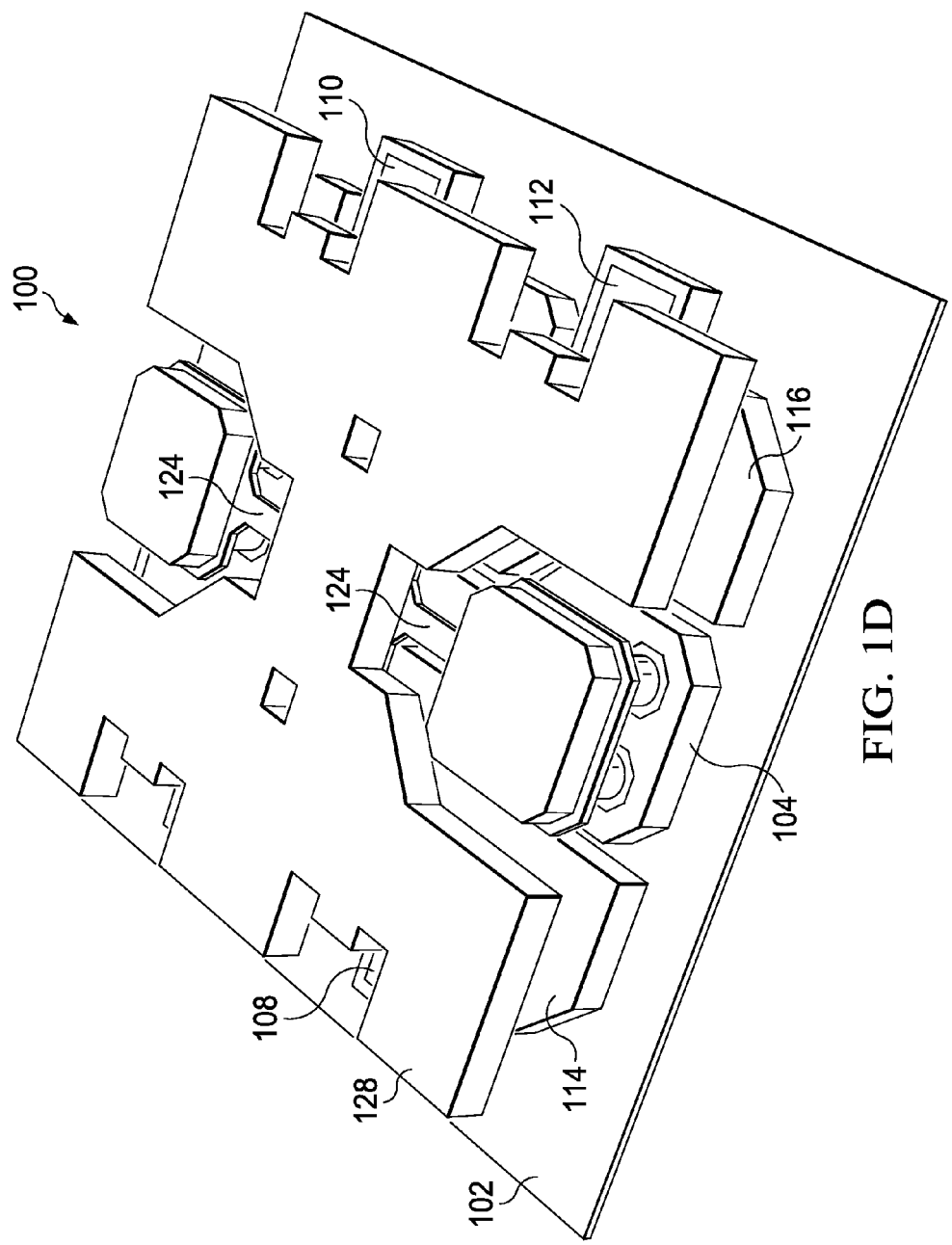

Referring to FIG. 1D, a channel isolation layer 128 is formed on the gate 126, not visible in FIG. 1D. The channel isolation layer 128 may be an inorganic dielectric layer such as silicon oxide, silicon nitride, silicon oxynitride, aluminum oxide, or may be an organic dielectric layer such as photoresist or polyimide. The channel isolation layer 128 may be formed by any of the processes described in reference to the electrode dielectric layer 118 depicted in FIG. 1B. In the version of the instant embodiment depicted in FIG. 1D, the channel isolation layer 128 does not contact the torsion hinge 124.

Figure 1E:
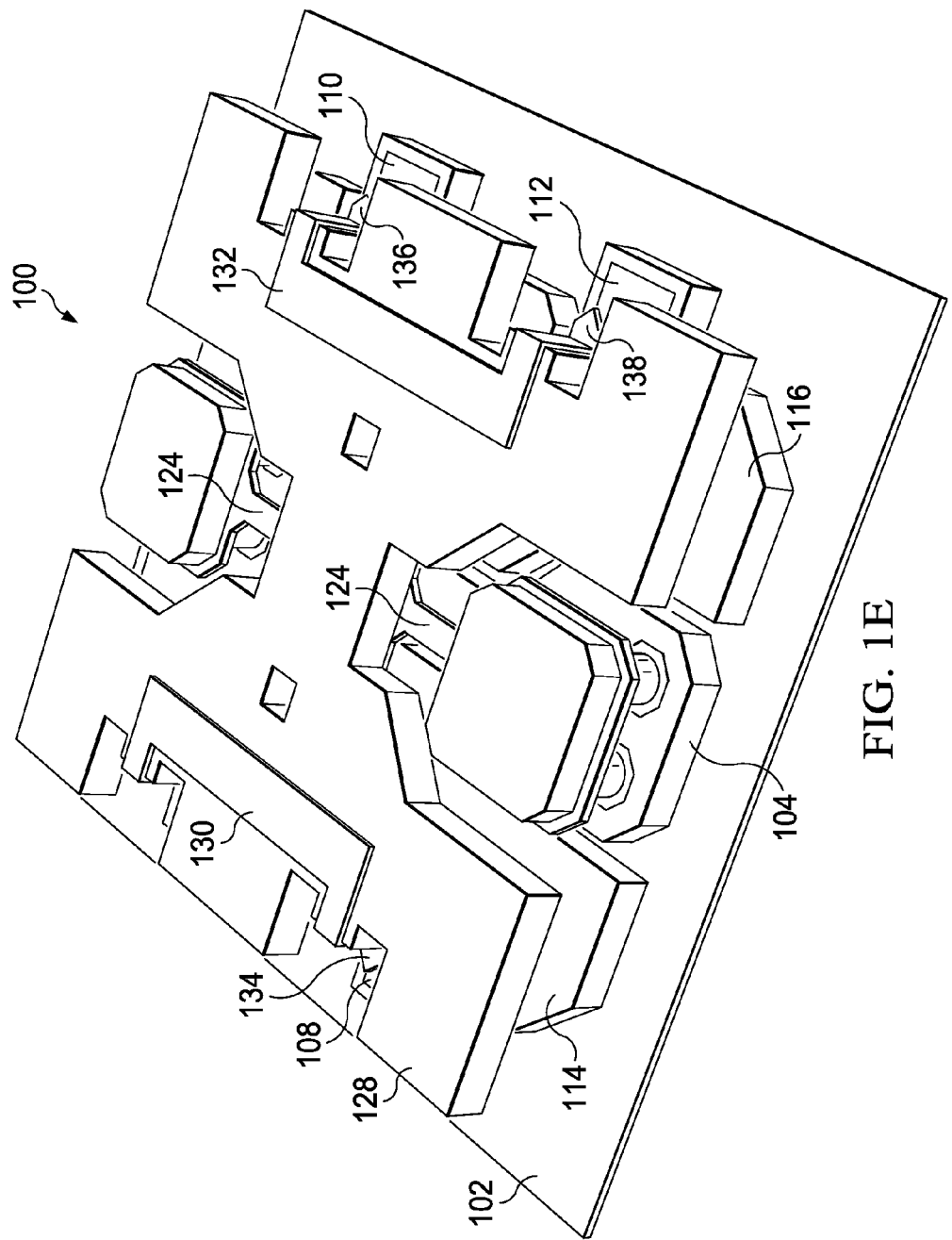

Referring to FIG. 1E, an electrically conductive first channel 130 and an electrically conductive second channel 132 are formed on the channel isolation layer 128. The first channel 130 and second channel 132 are electrically isolated from the gate 126, not visible in FIG. 1D, by the channel isolation layer 128. The first channel 130 includes a first source contact, not visible in FIG. 1E, and a first drain contact 134 which extends below the gate 126. The second channel 132 includes a second source contact 136 and a second drain contact 138 which extend below the gate 126. The first source contact is disposed over the first source landing pad 106, also not visible in FIG. 1E. The first drain contact 134 is disposed over the first drain landing pad 108. Similarly, the second source contact 136 is disposed over the second source landing pad 110, and the second drain contact 138 is disposed over the second drain landing pad 112. The first channel 130 and second channel 132 may be formed, for example, of titanium nitride, tantalum nitride, or other electrically conductive material which is suitable for electrical contacts in a MEMS logic device.

Figure 2:
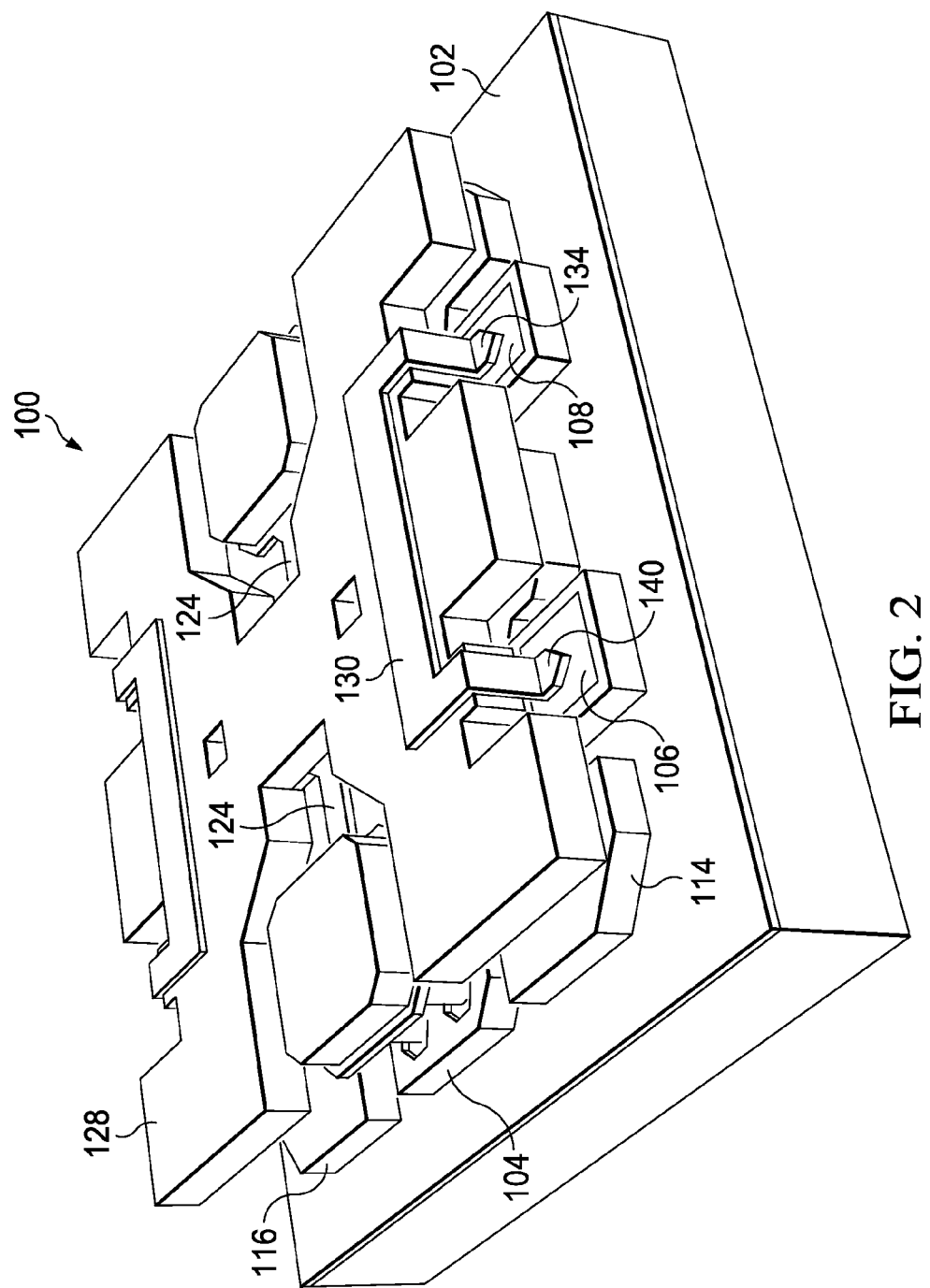
FIG. 2 depicts the MEMS logic device of FIG. 1E during operation.

FIG. 2 depicts the MEMS logic device of FIG. 1E during operation. The MEMS logic device 100 is rotated in FIG. 2 to more clearly show the first channel 130, the first source contact 140, the first drain contact 134, the first source landing pad 106 and the first drain landing pad 108. A threshold bias potential difference is applied between the gate terminal 104 and the first body bias element 114 so as to pivot the gate 126, not visible in FIG. 2, on the torsion hinge 124 down toward the substrate 102 so that the first source contact 140 touches and makes electrical contact with the first source landing pad 106 and the first drain contact 134 touches and makes electrical contact with the first drain landing pad 108. When the bias potential difference between the gate terminal 104 and the first body bias element 114 is reduced below a holding value, the gate 126 pivots about the torsion hinge 124 so that the first source contact 140 is lifted off the first source landing pad 106 and the first drain contact 134 is lifted off the first drain landing pad 108.

When the threshold bias potential difference is applied between the gate terminal 104 and the second body bias element 116, the gate will similarly pivot so that the second source contact 136 touches and makes electrical contact with the second source landing pad 110 and the second drain contact 138 touches and makes electrical contact with the second drain landing pad 112. When the bias potential difference between the gate terminal 104 and the second body bias element 116 is reduced below a holding value, the gate 126 pivots about the torsion hinge 124 so that the second source contact 136 is lifted off the second source landing pad 110 and the second drain contact 138 is lifted off the second drain landing pad 112.

In one version of the instant embodiment, the MEMS logic device 100 may occupy an area on the substrate 102 less than 200 square microns. In a further version, the MEMS logic device 100 may occupy an area on the substrate 102 less than 30 square microns. The threshold bias potential difference between the gate terminal 104 and the first body bias element 114, or between the gate terminal 104 and the second body bias element 116, may be between 4 and 8 volts. A switching time for the MEMS logic device 100, which is the time for the gate 126 to pivot and lift the first source contact 140 off the first source landing pad 106 and the first drain contact 134 off the first drain landing pad 108, and subsequently continue pivoting so that the second source contact 136 touches and makes electrical contact with the second source landing pad 110 and the second drain contact 138 touches and makes electrical contact with the second drain landing pad 112, or vice versa, may be less than 20 microseconds.

Figure 3:
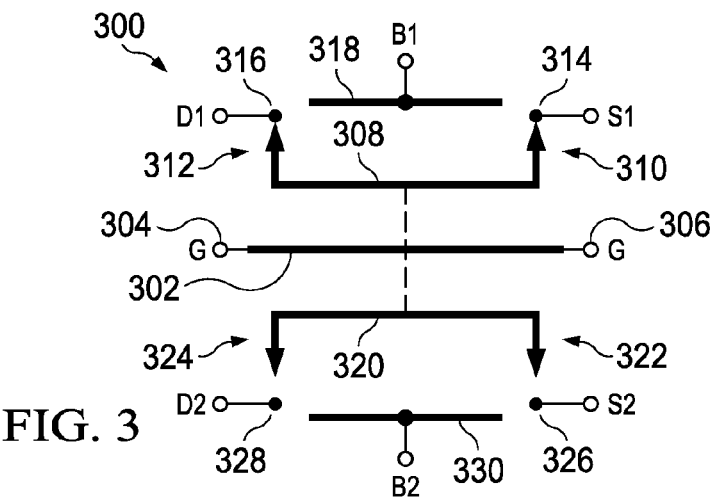
FIG. 3 is a schematic of the MEMS logic device.

FIG. 3 is a schematic of the MEMS logic device described in reference to FIG. 1E. The MEMS logic device 300 includes a gate 302, which may be biased at a first gate terminal 304, for example a first post supporting a torsion hinge connected to the gate 302 or a second gate terminal 306, for example a second post supporting the torsion hinge connected to the gate 302.

A first electrically conductive channel 308 is attached to the gate 302 but is electrically isolated from the gate 302. The first channel 308 includes a first source contact 310 and a first drain contact 312. The first source contact 310 makes electrical contact to a first source landing pad 314, and the first drain contact 312 makes electrical contact to a first drain landing pad 316. A first body bias element 318 is configured to pivot the gate 302 so as to make electrical contact between the first source contact 310 and the first source landing pad 314, and between the first drain contact 312 and the first drain landing pad 316.

A second electrically conductive channel 320 is attached to the gate 302 but is electrically isolated from the gate 302. The second channel 320 includes a second source contact 322 and a second drain contact 324. The second source contact 322 makes electrical contact to a second source landing pad 326, and the second drain contact 324 makes electrical contact to a second drain landing pad 328. A second body bias element 330 is configured to pivot the gate 302 so as to make electrical contact between the second source contact 322 and the second source landing pad 326, and between the second drain contact 324 and the second drain landing pad 328.

Figure 4:
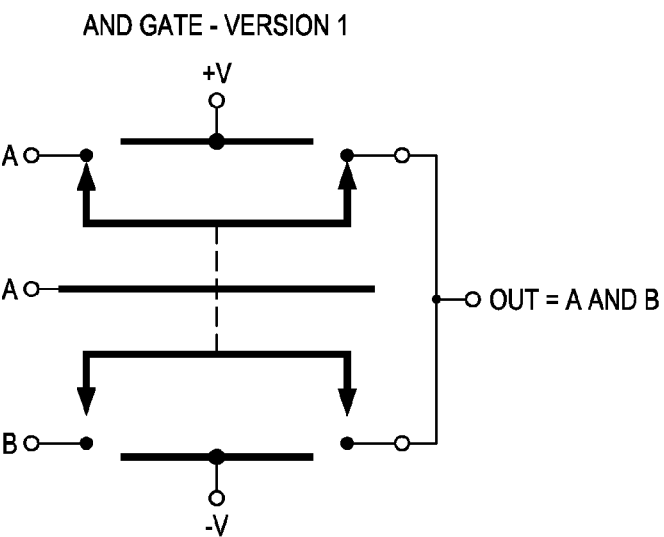
FIGS. 4 through 9 are schematic views of MEMS logic devices in various logic gate configurations.
Figure 4:
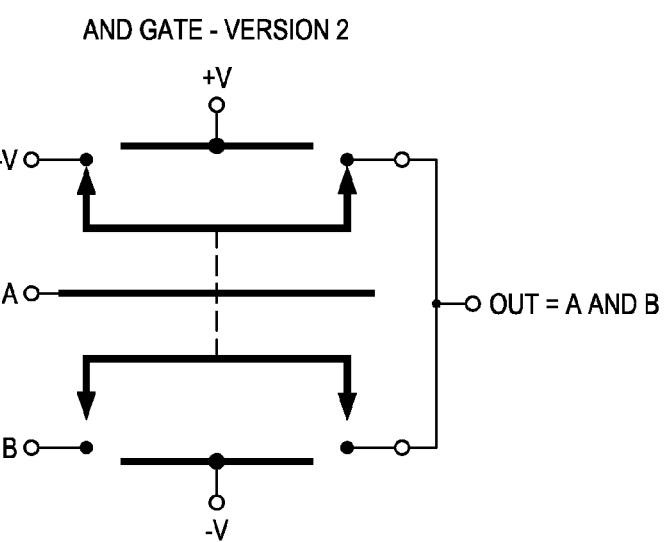

FIG. 4 through are schematic illustrations of MEMS logic devices in various logic gate configurations. A potential difference between bias levels +V and −V provides a threshold for operation of a gate of the MEMS logic device, as described in reference to FIG. 2. Signals A and B have values substantially equal to +V and/or −V, so that application of signal A to the gate of the MEMS logic device will result in the gate pivoting so as to electrically connect either the first channel with the first source landing pad and the first drain landing pad or the second channel with the second source landing pad and the second drain landing pad.

Figure 5:
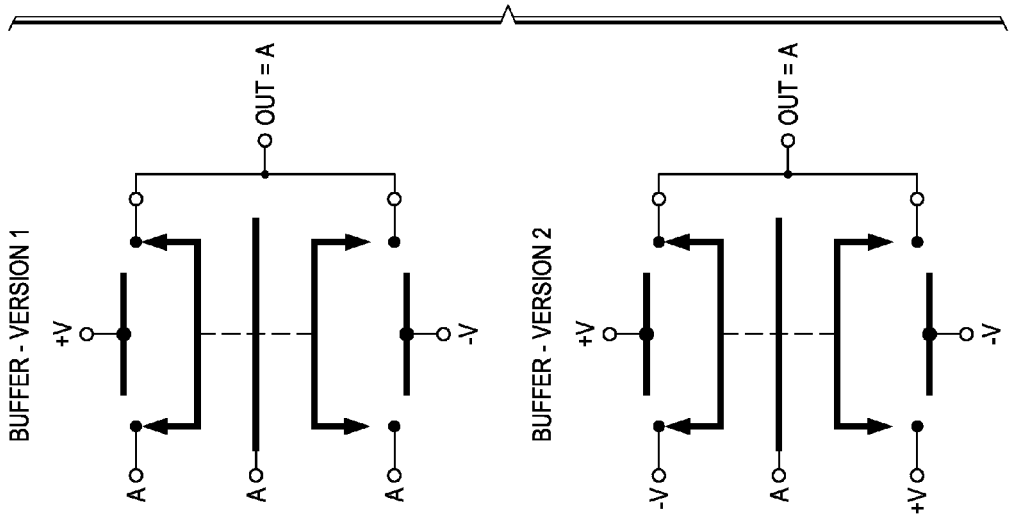
Figure 6:
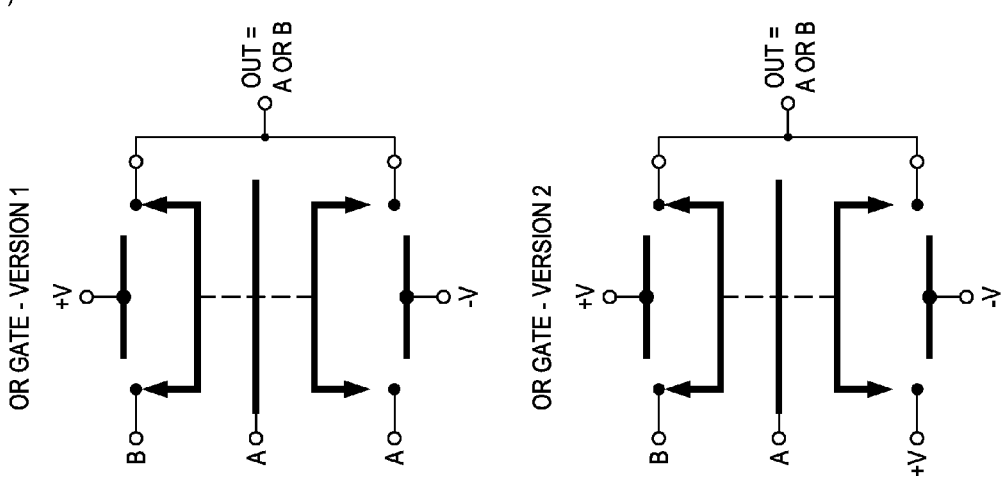
Figure 7:
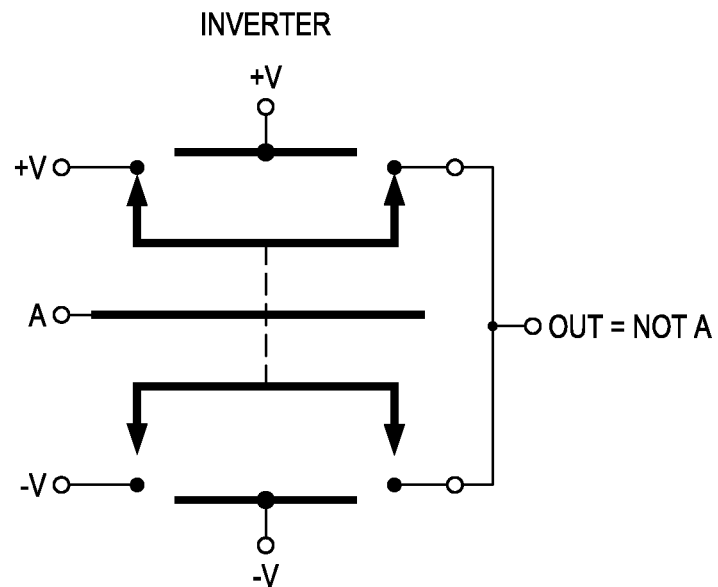
Figure 8:
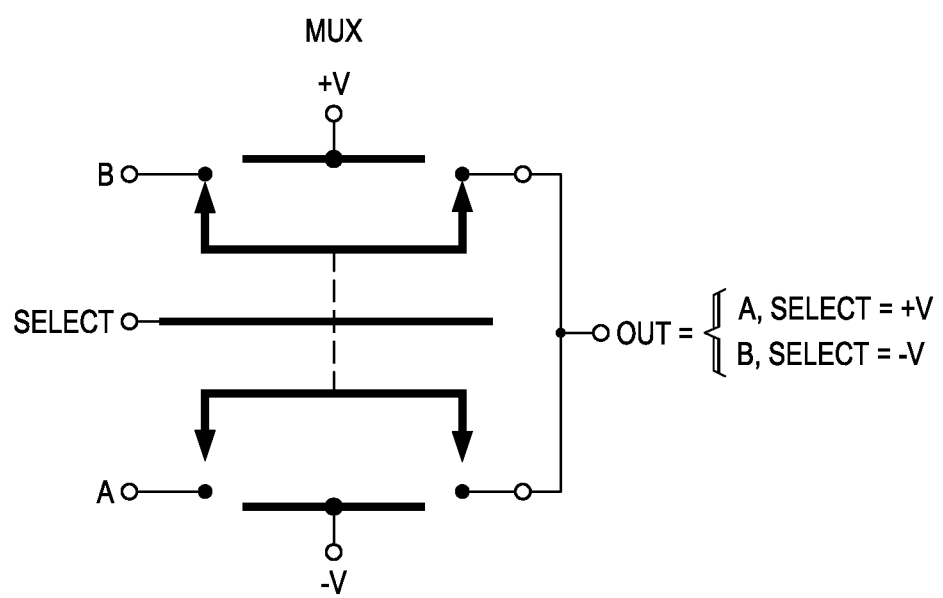

FIG. 4 shows two versions of MEMS logic devices configured as AND gates. Other configurations of the MEMS logic device providing an AND gate functionality are within the scope of the instant invention. FIG. 5 shows two versions of MEMS logic devices configured as OR gates. Other configurations of the MEMS logic device providing an OR gate functionality are within the scope of the instant invention. FIG. 6 shows two versions of MEMS logic devices configured as buffers. FIG. 7 shows a MEMS logic device configured as an inverter. FIG. 8 shows a MEMS logic device configured as a digital multiplexer.

Figure 9:
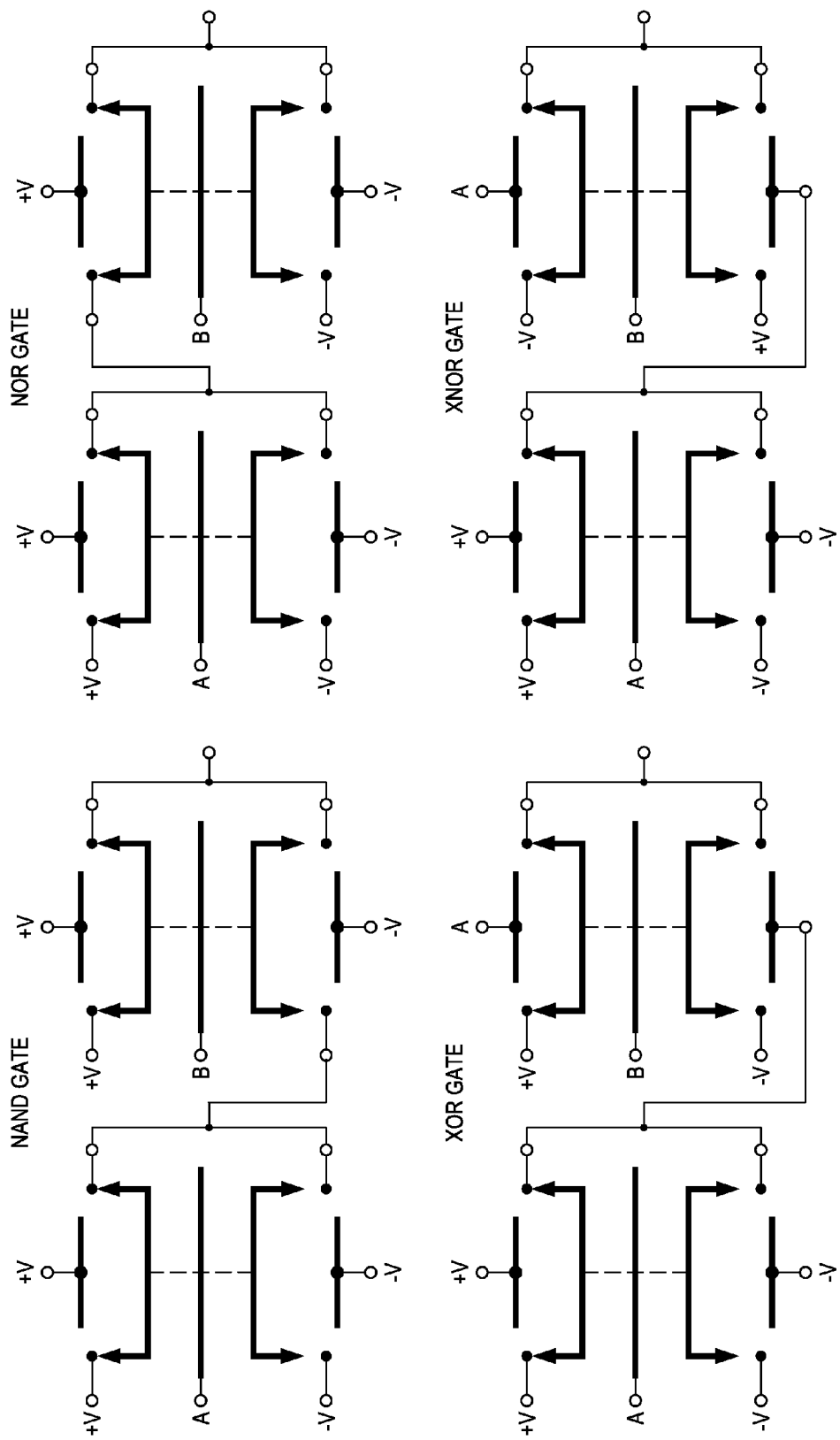

FIG. 9 shows cascaded pairs of MEMS logic devices configured as a NAND gate, an NOR gate, an exclusive OR gate also known as an XOR gate, and an exclusive NOR gate (also known as an ANOR gate).

MEMS logic devices configured as logic gates may be cascaded so that an output of a first gate may be connected to an input of a second gate. The MEMS logic device configurations depicted in FIG. 4 through FIG. 9 may be used to provide form adders, shift registers, oscillators, delay buffers and other logic circuits.

Figure 10:
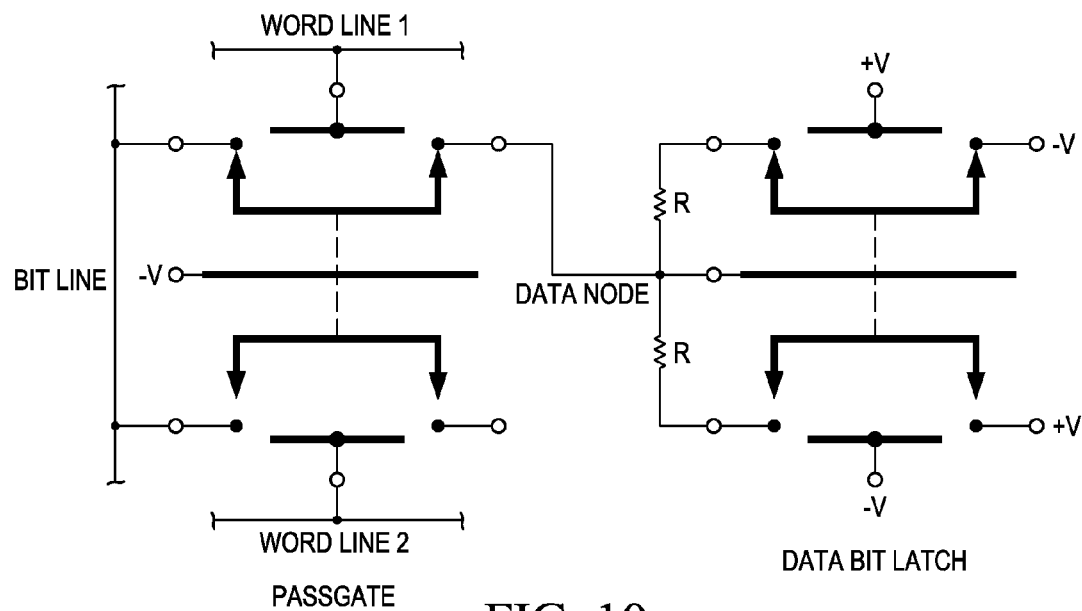
FIG. 10 depicts a MEMS logic device configured as a memory cell.

FIG. 10 depicts a MEMS logic device. configured as a data bit latch of a memory cell. A potential of V+ or V−, representing a data bit value, is applied to a bit line which is coupled to a data node connected to a gate of the data bit latch MEMS logic device through a pass gate. The pass gate may be another MEMS logic device, as depicted in FIG. 10, a CMOS pass gate device, or other switch device. When the pass gate is turned on, so as to provide a low impedance path from the bit line to the data node, the gate of the data bit latch MEMS logic device pivots as described in reference to FIG. 2. Resistors between the data node and first and second drain landing pads enable a holding potential on the data node so that the gate remains in the same position when the pass gate is turned off. The potential on the data node may be read by connecting the bit line to a sense amplifier or other voltage sensing circuit and turning on the pass gate.

In the version of the instant embodiment depicted in FIG. 10, the pass gate is a second MEMS logic device. Applying a potential of +V to word line 1 connected to a first body bias element of the pass gate will cause the bit line to be electrically coupled to the data node through a first channel of the pass gate. Applying a potential of −V to the word line 1 will cause the bit line to be electrically uncoupled to the data node. The pass gate may also provide connection to a second data bit latch, not shown, which may be accessed by connecting a second word line, word line 2, to a second body bias element of the pass gate, as depicted in FIG. 10

Figure 11:
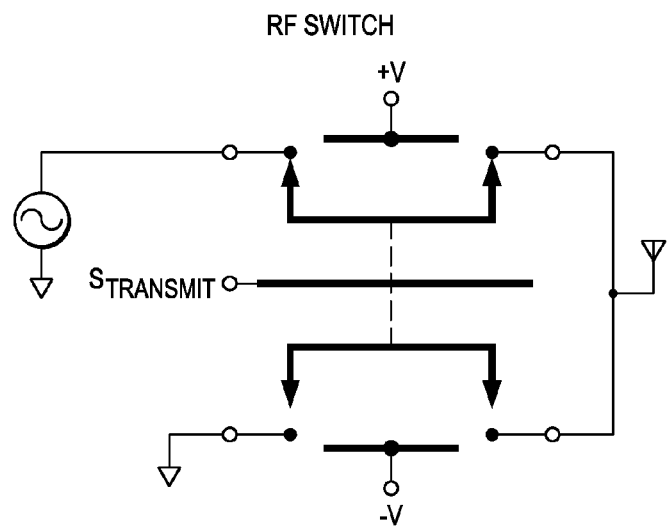
FIG. 11 depicts a MEMS logic device configured as an RF switch.

FIG. 11 depicts a MEMS logic device configured as a radio frequency (RF) switch. Applying a value of −V to gate signal $S_{TRANSMIT}$ causes a gate of the MEMS logic device to pivot so as to connect an RF signal source to an antenna. Applying a value of +V to gate signal $S_{TRANSMIT}$ causes the gate to pivot so as to ground the antenna. The MEMS logic device may have lower insertion loss than a transistor RF switch in an integrated circuit containing the RF MEMS logic device.

Figure 12:
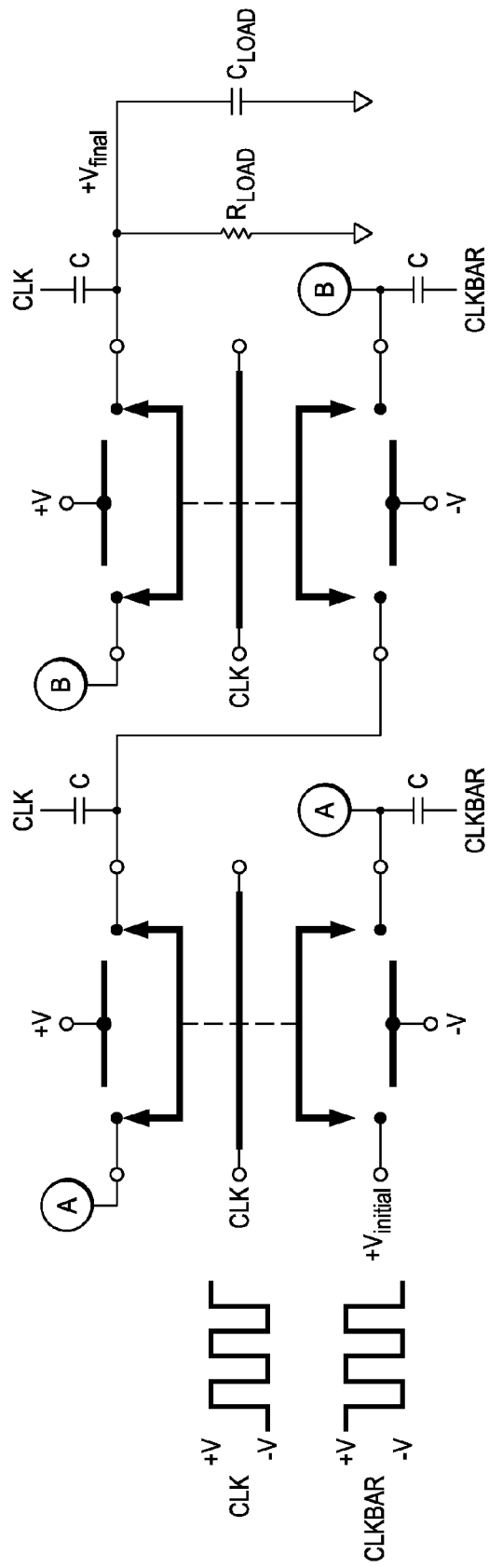
FIG. 12 depicts two MEMS logic devices configured as a charge pump.

FIG. 12 depicts two MEMS logic devices configured as a charge pump. A clock signal, CLK, which swings between +V and −V is applied to gates of the MEMS logic devices and to lower plates of upper capacitors of the charge pump. An opposite phase clock signal, CLKBAR, which swings between +V and −V directly oppositely from clock signal CLK, is applied to lower plates of lower capacitors of the charge pump. A potential of $V_{initial}$ applied to a second drain landing pad of the first MEMS logic device may be increased to a value of $V_{final}$ at a first source landing pad of the second MEMS logic device. $V_{final}$ may be as much as four times as large as $V_{initial}$ for the charge pump depicted in FIG. 12. Additional stages may be added to the charge pump to obtain a higher value of $V_{final}$.

Figure 13:
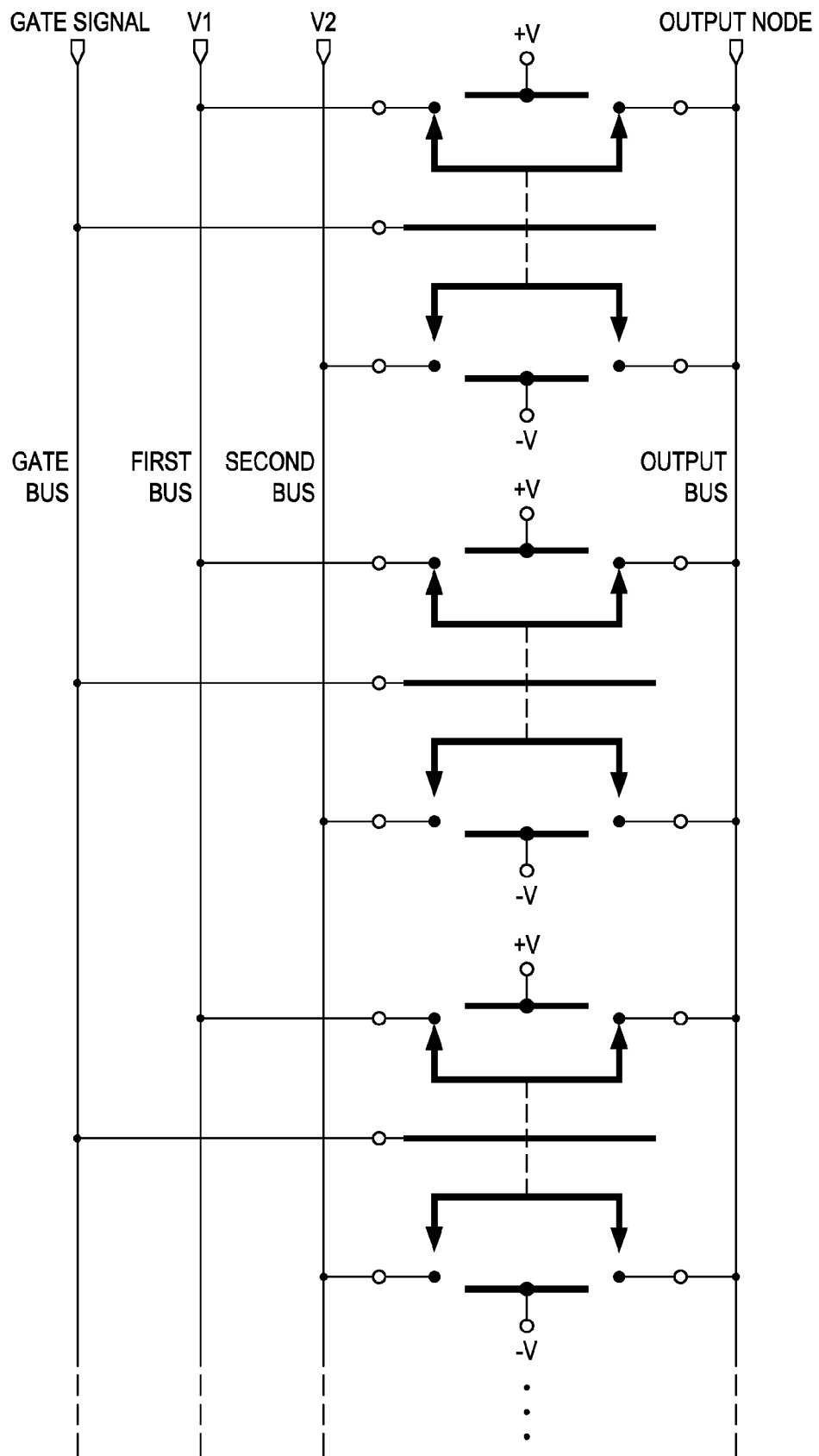
FIG. 13 depicts a plurality of MEMS logic devices configured in parallel to form a power switching device.

FIG. 13 depicts a plurality of MEMS logic devices configured in parallel to form a power switching device. A first drain landing pad of each MEMS logic device is connected to a first bus connected to a first potential V1. A second drain landing pad of each MEMS logic device is connected to a second bus connected to a second potential V2, for example ground. A gate of each MEMS logic device is connected to a gate bus connected to a gate signal. A first source landing pad and a second source landing pad of each MEMS logic device is connected to an output node through an output bus. Applying a gate signal of −V to the gate bus will connect the first bus to the output bus through a parallel combination of first channels of each MEMS logic device, to as to provide first potential V1 to the output node. Applying a gate signal of +V to the gate bus will connect the second bus to the output bus through a parallel combination of second channels of each MEMS logic device, to as to provide second potential V2 to the output node. The parallel configuration depicted in FIG. 13 may advantageously provide a switching capability for currents above a capacity of a single MEMS logic device.

Figure 14:
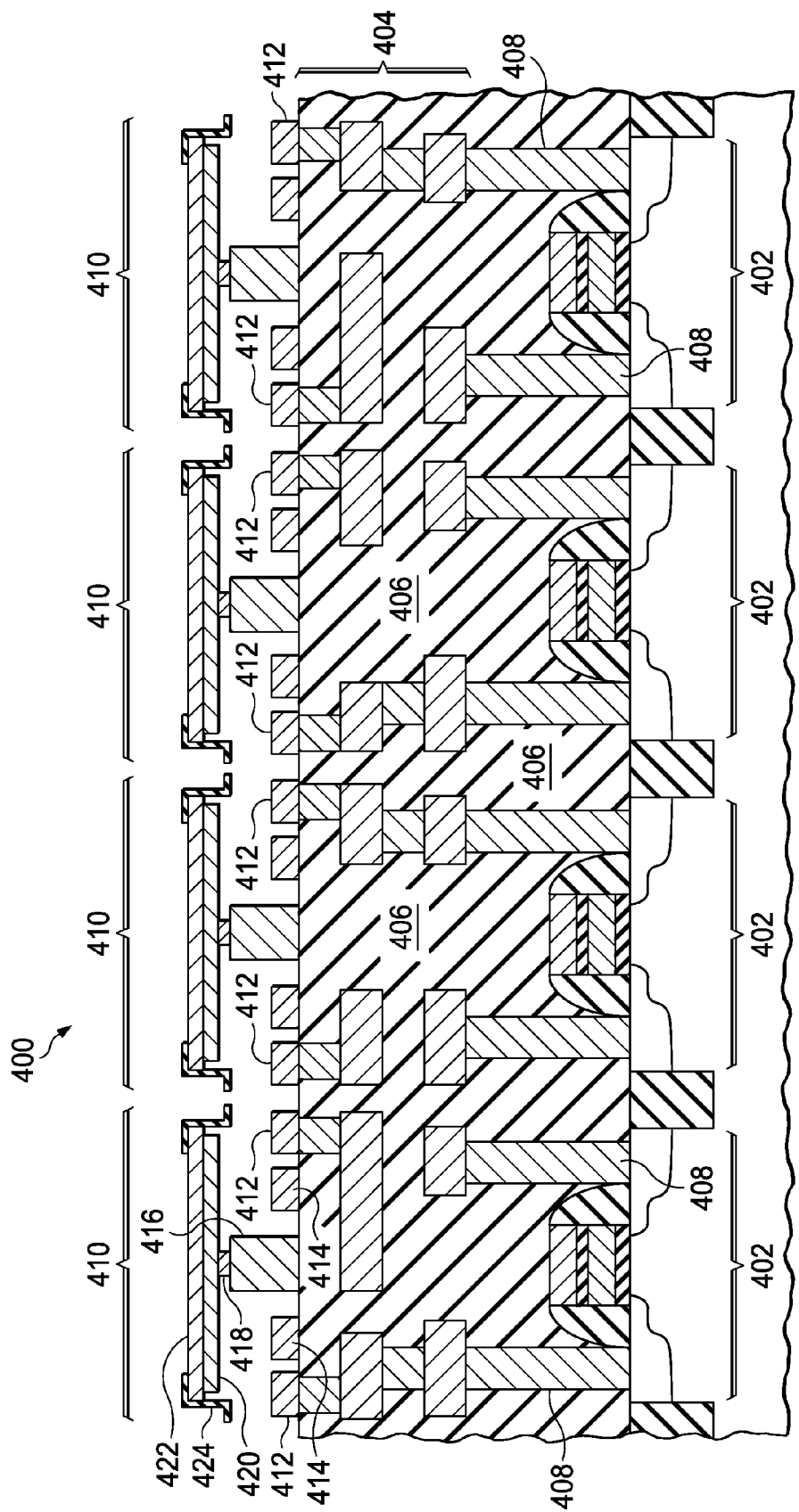
FIG. 14 is a cross-sectional view of an integrated circuit containing multiple MEMS logic devices according to an embodiment.

FIG. 14 shows an integrated circuit containing multiple MEMS logic devices according to an embodiment. The integrated circuit 400 includes transistors 402 connected to metal interconnects 404 by contacts 408. The metal interconnects 404 may be primarily aluminum formed by depositing aluminum followed by etching to remove unwanted metal, or may be primarily copper formed by a damascene process. The metal interconnects 404 are in an interconnect dielectric layer 406 which may be layers of silicon oxide, silicon nitride, silicon oxynitride, low-k dielectric materials such as organo-silicate glass (OSG), carbon-doped silicon oxides (SiCO or CDO) or methylsilsesquioxane (MSQ), or other dielectric materials. The interconnects 404 and interconnect dielectric layer 406 provide a substrate for the MEMS logic devices 410, which may be configured evenly spaced in an array as depicted in FIG. 14. Source and drain landing pads 412 of the MEMS logic devices are connected to instances of the metal interconnects 404. The MEMS logic devices include body bias elements 414, hinge posts 416, torsion hinges 418, gates 420, channel isolation layers 422 and channels 424. The gate terminals 416 may be electrically coupled to instances of the metal interconnects 404 so that functional configurations of the MEMS logic devices 410 may be changed in separate instances of the integrated circuit 400 by changing layouts of the metal interconnects 404. For example, one instance of the integrated circuit 400 may have metal interconnects 404 arranged so that the MEMS logic devices are configured to provide a 4-bit adder, while another instance of the integrated circuit 400 may have metal interconnects 1404 arranged so that the MEMS logic devices are configured to provide a shift register.

Figure 15:
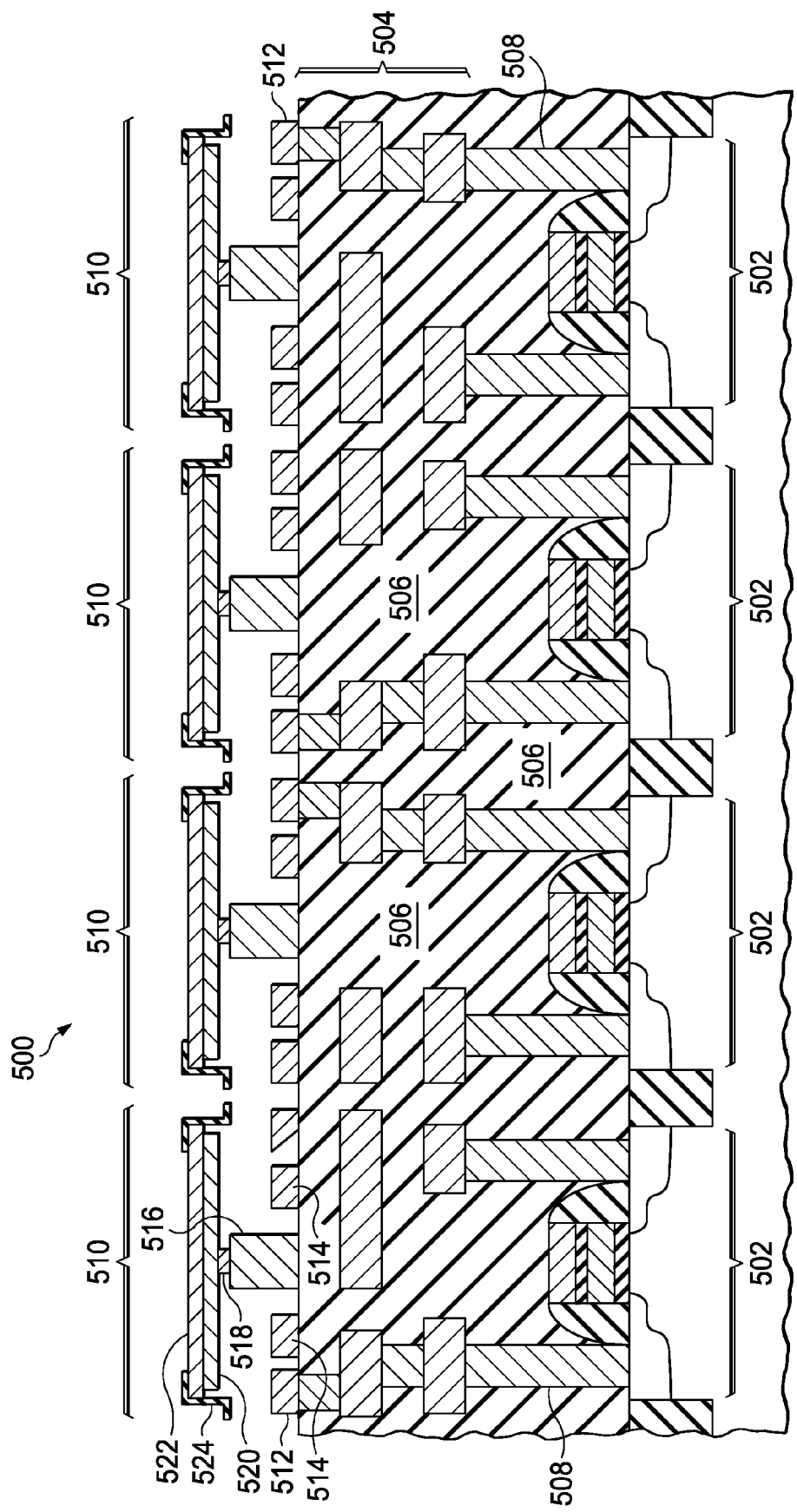
FIG. 15 is a cross-sectional view of an integrated circuit containing multiple MEMS logic devices according to an alternate embodiment.

FIG. 15 shows an integrated circuit containing multiple MEMS logic devices according to an alternate embodiment. The integrated circuit 500 includes transistors 502, for example electrically erasable programmable read-only memory (EEPROM) transistors, connected to metal interconnects 504 through contacts 508. The metal interconnects 504 and contacts 508 are in an interconnect dielectric layer 506, which may include a plurality of layers of different dielectric materials. The interconnects 504 and interconnect dielectric layer 506 provide a substrate for the MEMS logic devices 510. Source and drain landing pads 512 of the MEMS logic devices are connected to instances of the transistors 502 through the metal interconnects 504 and contacts 506. The MEMS logic devices include body bias elements 514, hinge posts 516, torsion hinges 518, gates 520, channel isolation layers 522 and channels 524. The gate terminals 520 may be electrically coupled to instances of the transistors 502 so that functional configurations of the MEMS logic devices 510 may be changed in separate instances of the integrated circuit 500 by changing programmed states of the transistors 502. For example, one instance of the integrated circuit 500 may have transistors 502 programmed so that the MEMS logic devices 510 are configured to provide a 4-bit adder, while another instance of the integrated circuit 500 may have transistors 502 programmed so that the MEMS logic devices 510 are configured to provide a shift register.

In some versions of the integrated circuits described in reference to FIGS. 14 and 15, the MEMS logic devices may switch signals with voltages greater than voltages used to operate the transistors. For example, the MEMS logic devices may switch signals between 4 and 8 volts, while the transistors may operate at less then 2 volts.

Those skilled in the art to which the invention relates will appreciate that modifications may be made to the example embodiments and additional embodiments realized within the scope of the claimed invention.

What is claimed is:

1. An integrated circuit, comprising:
    a microelectromechanical system (MEMS) logic device including:
        an electrically conductive terminal on a substrate;
        electrically conductive first source and first drain landing pads on the substrate proximate to a first side of the terminal;
        electrically conductive second source and second drain landing pads on the substrate proximate to a second side opposite to the first side of the terminal;
        an electrically conductive first body bias element on the substrate adjacent to the first side of the terminal;
        an electrically conductive second body bias element on the substrate adjacent to the second side of the terminal;
        an electrically conductive torsion hinge electrically connected to the terminal;
        an electrically conductive pivotable gate attached to and supported above the substrate on the torsion hinge;
        an isolation layer on the pivotable gate;
        an electrically conductive first channel on the isolation layer, the first channel including a first source contact over the first source landing pad and a first drain contact over the first drain landing pad, the first channel being electrically isolated from the pivotable gate; and
        an electrically conductive second channel on the isolation layer, the second channel including a second source contact over the second source landing pad and a second drain contact over the second drain landing pad, the second channel being electrically isolated from the pivotable gate.

2. The integrated circuit of claim 1, wherein the MEMs logic device is an AND gate.

3. The integrated circuit of claim 1, wherein the MEMs logic device is an OR gate.

4. The integrated circuit of claim 1, wherein the MEMs logic device is a buffer.

5. The integrated circuit of claim 1, wherein the MEMs logic device is an inverter.

6. The integrated circuit of claim 1, wherein the MEMs logic device is a digital multiplexer.

7. The integrated circuit of claim 1, wherein the MEMs logic device is a NAND gate.

8. The integrated circuit of claim 1, wherein the MEMs logic device is a NOR gate.

9. The integrated circuit of claim 1, wherein the MEMs logic device is an exclusive OR gate.

10. The integrated circuit of claim 1, wherein the MEMs logic device is an exclusive NOR gate.

11. The integrated circuit of claim 1, wherein the MEMs logic device is a data bit latch of a memory cell.

12. The integrated circuit of claim 1, wherein the MEMs logic device is a radio frequency (RF) switch.

* * * * *